(12) United States Patent
Bello et al.

(10) Patent No.: US 7,645,513 B2
(45) Date of Patent: Jan. 12, 2010

(54) CUBIC BORON NITRIDE/DIAMOND COMPOSITE LAYERS

(75) Inventors: Igor Bello, London (CA); Wenjun Zhang, Kowloon (HK); Shuit-Tong Lee, New Territories (HK)

(73) Assignee: City University of Hong Kong, Kowloon (HK)

( * ) Notice: Subject to any disclaimer, the term of this patent is extended or adjusted under 35 U.S.C. 154(b) by 24 days.

(21) Appl. No.: 11/207,535

(22) Filed: Aug. 19, 2005

(65) Prior Publication Data
US 2006/0147282 A1 Jul. 6, 2006

Related U.S. Application Data

(63) Continuation-in-part of application No. 10/366,880, filed on Feb. 14, 2003, now abandoned.

(51) Int. Cl.
*B32B 9/00* (2006.01)
(52) U.S. Cl. ............... 428/408; 428/216; 428/336; 428/704
(58) Field of Classification Search ............ 428/408, 428/704, 216, 336, 469
See application file for complete search history.

(56) References Cited

U.S. PATENT DOCUMENTS

| | | | |
|---|---|---|---|
| 4,707,384 A * | 11/1987 | Schachner et al. | 428/408 |
| 4,783,368 A | 11/1988 | Yamamoto et al. | |
| 5,117,267 A * | 5/1992 | Kimoto et al. | 257/78 |
| 5,236,545 A | 8/1993 | Pryor | |
| 5,639,551 A * | 6/1997 | Ong et al. | 428/408 |
| 5,656,828 A | 8/1997 | Zachai et al. | |
| 5,718,948 A * | 2/1998 | Ederyd et al. | 428/552 |
| 5,777,422 A | 7/1998 | Kitabayashi et al. | |
| 5,855,998 A | 1/1999 | Tanabe et al. | |
| 5,959,389 A | 9/1999 | Nakahata et al. | |
| 6,054,719 A | 4/2000 | Füsser et al. | |
| 6,642,813 B1 | 11/2003 | Itakura et al. | |
| 6,661,313 B2 | 12/2003 | Naumenko et al. | |
| 6,838,807 B2 | 1/2005 | Ozaki et al. | |

OTHER PUBLICATIONS

Pascallon et al "Microstructure of c-BN thin films deposited of diamond films", Diamond & Related Materials 8 (1999) p. 325-330.*

(Continued)

*Primary Examiner*—Archene Turner
(74) *Attorney, Agent, or Firm*—Bose McKinney & Evans LLP

(57) ABSTRACT

Cubic boron nitride/diamond (cBND) composite films with excellent adherence to various substrates and their fabrication method are disclosed. The cBND composite confining cBN can be prepared without any amorphous/turbostratic BN (aBN/tBN) incubation layers. The cBND composite is established on the compatibility of structural and physical properties of two superior materials: cBN on top and diamond beneath. The underlying diamond is adapted to the substrate of choice using a variety of methods which may include prescratching the substrates, bias enhanced nucleation, etching for depleting undesirable chemical elements, construction of buffer layers and gradient buffer layers for the isolation of undesirable chemical elements or/and adaptation of physical properties. The diamond nuclei are preferably formed either by bias-enhanced nucleation or by pre-scratching the substrate prior to nucleation. The cBN films in cBND composites of the present invention can grow directly on the underlaying diamond films in heteroepitaxial relationships.

16 Claims, 8 Drawing Sheets

OTHER PUBLICATIONS

Kester et al "Growth and characterization of cubic boron nitride thin films", J. Vac. Sci. Technol. A 12(6), Nov./Dec. 1994 p. 3074-3081.*

Okamoto et al "Formation of Cubic Boron Nitride Films on Diamond by Plasma CVD Technique", Japanese Journal of Applied Physics, vol. 29, No. 6, Jun. 1990 pp. L 1004-1006.*

Zhang et al "epitaxy of cubic boron nitride on (001)-oriented diamond", nature materials, vol. 2, May 2003 p. 312-315.*

Yang et al "effect of diamond films as bufferlayer on formation of cubic boron nitride films by chemical vapor deposition", Thin Solid Films 447-448, (2004) p. 136-141.*

"High-Temperature Cubic Boron Nitride P-N Junction Diode Made at High Pressure" by Mishima et al.; Science; vol. 238; Oct. 9, 1987; pp. 181-183.

"Preparation of Semiconducting Cubin Boron Nitride" by Wentorf, Jr.; The Journal of Chemical Physics; vol. 36, No. 8; Apr. 15, 1992; pp. 1990-1991.

"New Trends in High-Pressure Synthesis of Diamond" by Novikov; Diamond and Related Materials 8 (1999); pp. 1427-1432.

"Vapour Phase Deposition of Cubic Boron Nitride" by Yoshida; Diamond and Related Materials 5 (1996); pp. 501-507.

"Oriented CVD Diamond Films: Twin Formation, Structure and Morphology" by Wild et al.; Fraunhofer-Institut für Angewandte Festkörperphysik; © 1994—Elsevier Sequoia; eleven (11) pages.

"Review of Advances in Cubie Boron Nitride Film Synthesis" by Mirkarimi et al.; Materials Science and Engineering, R21 (1997); pp. 47-100.

"Structure Analysis of cBN Films Prepared by DC Jet Plasma CVD from an $Ar-N_2-BF_3-H_2$ Gas System" by Zhang et al.; Diamond and Related Materials 10 (2001); pp. 1881-1885.

"Heteroepitaxial Diamond Growth on (100) Silicon" by Jiang et al.; Diamond and Related Materials 2 (1993); pp. 1112-1113.

Nakahata et al., "Study on Surface Acoustic Wave Characteristics of $SiO_2$/Interdigital-Transducer/ZnO/Diamond Structure and Fabrication of 2.5 GHz Narrow Band Filter," Jpn. J. Appl. Phys., vol. 37 (1998) pp. 2918-2922.

Elmazria et al., "High Velocity SAW Using Aluminum Nitride Film on Unpolished Nucleation Side of Free-Standing Cvd Diamond," IEEE Transactions on Ultrasonics, Ferroelectrics, and Frequency Control, vol. 50, No. 6, Jun. 2003, pp. 710-715.

Nakahata et al., "High Frequency Surface Acoustic Wave Filter Using ZnO/Diamond/Si Structure,"Jpn. J. Appl. Phys., vol. 33 (1994) pp. 324-328.

Iriarte et al., "Surface acoustic wave propagation characteristics of aluminum nitride thin films grown on polycrystalline diamond," Journal of Applied Physics, vol. 93, No. 12, 15 Jun. 2003, pp. 9604-9609.

Bi et al., "Surface acoustic waves on nanocrystalline diamond," Diamond and Related Materials 11 (2002) pp. 677-680.

Bénédic et al., "Surface acoustic wave devices based on nanocrystalline diamond and aluminum nitride," Diamond and Related Materials 13 (2004) pp. 347-353.

Uemura et al., "Low-Loss Diamond Surface Acoustic Wave Devices Using Small-Grain Poly-Crystalline Diamond," Jpn. J. Appl. Phys., vol. 41 (2002) pp. 3476-3479.

Ishihara et al., Synthesis and Surface Acoustic Wave Property of Aluminum Nitride Thin Films Fabricated on Silicon and Diamond Substrates Using the Sputtering Method, Jpn. J. Appl. Phys., vol. 40 (2001) pp. 5065- 5068.

Zhang et al., "Epitaxy on Diamond by Chemical Vapor Deposition: a Route to High-Quality Cubic Boron Nitride for Electronic Applications," Adv. Mater. 2004, 16, No. 16, Aug. 18, pp. 1405-1408.

* cited by examiner

… … …

CUBIC BORON NITRIDE/DIAMOND COMPOSITE LAYERS

RELATED APPLICATIONS

This application is a continuation in part application from U.S. patent application Ser. No. 10/366,880, filed Feb. 14, 2003 now abandoned.

FIELD OF THE INVENTION

The present invention relates to the formation of cubic boron nitride/diamond (cBND) composite layer structures useful for depositing cubic boron nitride on a variety of substrates such as metals, alloys and semiconductor materials with the provision of high film adherence to the substrate. Such cBND structures may then be used in electronic and mechanical applications including protective, tribological coatings, and coating of machine tools.

BACKGROUND OF THE INVENTION

Boron nitride (BN), by analogy to carbon, can appear in a cubic crystalline structure (cBN) similar to diamond and a hexagonal crystalline form (hBN) like that of graphite. BN can also exist in lonsdaleite-like wurtzitic (wBN), rhombohedral (rBN) and turbostratic (tBN) phases. Among these allotropes $sp^3$-bonded cBN in zinc-blend structure is the most attractive crystalline form. The strong covalent bonds and high atom density make cBN a unique material with properties comparable to those of diamond. cBN has the widest band gap (>6 eV) among all the covalent-bonded materials, the second highest hardness next to diamond, extraordinary chemical inertness, high electrical resistivity, high carrier mobility, and extremely high thermal conductivity. Cubic BN has the second highest elastic modulus and second highest thermal conductivity next to diamond, but it surpasses diamond in chemical properties. Cubic BN has considerably higher oxidation temperature, higher graphitization temperature and high chemical inertness. While diamond is dissolved and graphitized in iron and other ferrous materials, cBN does not react even with molten ferrous materials.

The unusual combination of its physical and chemical properties makes cBN a potentially very useful material for the fabrication of cutting tools, thermal, optical, and high-temperature and high-frequency electronic devices. Although cBN has a slightly lower hardness and smaller thermal conductivity than diamond, it is superior to diamond in mechanical applications due to its chemical inertness to ferrous materials up to temperatures of 1500-1600 K. Therefore, cBN is a very good material for machining ferrous materials and their composites.

Furthermore, cBN can be doped for either p-type or n-type conductivities while n-type doping of diamond is still problematic. Hence, cBN is also a better candidate for fabricating high-speed, high-power electronic devices operating at high temperature [O. Mishima, J. Tanaka, S. Yamaoka, and O. Fukunaga, *Science* vol. 238, pps. 181-183, "High-temperature cubic boron nitride p-n junction diode made at high pressure", 1987].

The study of the synthesis and characterization of cBN and diamond started almost simultaneously in the early 1960s [R. H. Wentorf, Jr., *J. Chem. Phys.* Vol. 36. pps. 1990-1991, "Preparation of semiconducting cubic boron nitride", 1962]. To date, cBN has been commercially synthesized in large quantities as powders with sizes ranging from submicron to millimeters by a high-pressure high-temperature (HPHT) method [N. V. Novikov, *Diamond Relat. Mater.*, vol. 8, pps. 1427-1432, "New trends in high-pressure synthesis of diamond", 1999]. Together with HPHT diamond, HPHT cBN has a large market especially in cutting tools and wear parts.

The severe nature of the HPHT methods and the limited size of cBN grains produced, however, rule out some of its attractive potential applications. Research in chemical vapor deposition (CVD) of diamond films has progressed well and CVD diamond has been implemented in some industrial areas such as protective coats, cutting inserts, heat sinks, optical windows, etc. Methods have been developed for growing diamond films at reduced temperatures and pressures. However, diamond films are not well-suited for cutting or abrading ferrous materials. Diamond reacts with iron forming soots at the high temperatures generated during cutting operations.

Accordingly, it would be desirable to provide a method for the implementation of cBN films on tools. However, because known cBN films grow via soft amorphous and turbostratic boron nitride (aBN and tBN) and exhibit high stress, they suffer from poor adhesion. That is, the known cBN films have an aBN/tBN/cBN interfacial structure that has a number of defects, particularly dangling boron bonds, which cause the films to be undesirably highly reactive and also cause high instability. These films tend to delaminate from the substrate to which they are adhered. For this reason, these cBN films have not been implemented in practice.

Cubic boron nitride films can be deposited by both physical vapor deposition (PVD) and CVD methods. For PVD methods, bombardment of substrates by energetic species (tens to hundreds of eV) is known to be important to the formation of the cBN phase [T. Yoshida, *Diamond Relat. Mat., vol.* 5, pps. 501-507, "Vapour phase deposition of cubic boron nitride", 1996; P. B. Mirkarimi, K. F. McCarty, and D. L. Medlin, *Mater. Sci. Eng.*, vol. R21, pps. 47-100, "Review of advances in cubic boron nitride film synthesis", 1997]. Since ion bombardment is associated with a considerable internal stress that restricts the maximal thickness of adherent, non-delaminating cBN films to ~200 nm, this presents a further obstacle to its practical application.

For CVD, by using boron trifluoride as the boron source, thick cBN films may be deposited by DC jet plasma CVD and microwave plasma CVD. It is known that fluorine can selectively etch non-cubic BN. The substrate bias needed for the formation of cBN phase is dramatically reduced using CVD and correspondingly the residual stress in the films was reduced. However, the cBN films deposited by this method still grow via the layered structure of amorphous and textured hexagonal (turbostratic, tBN) phases [W. J. Zhang, S. Matsumoto, K. Kurashima, and Y. Bando, *Diamond Relat. Mater., vol.* 10, pps. 1881-1885, "Structure analysis of cBN films prepared by DC jet plasma CVD from an Ar—$N_2$—$BF_3$—$H_2$ gas system", 2001], serving as incubation layers for cBN nucleation. However, the existence of the amorphous/turbostratic interface causes random orientation of the cBN film, and diminishes the film adhesion in humid environments. Therefore, adherent cBN films to a substrate without aBN/tBN transition layers, non-sensitive to humidity and even grown in an epitaxial relationship to the substrate are highly desired to meet practical applications.

SUMMARY OF THE INVENTION

The present invention provides a composite structure comprising diamond and cubic boron nitride that can be formed in a wide range of thicknesses and exhibits improved properties that make it suitable for a wide variety of mechanical and electrical applications.

In one form thereof, the present invention provides a composite structure comprising a diamond layer and a layer of substantially pure cubic boron nitride (cBN) adjacent to and in contact with the diamond layer.

In exemplary embodiments, the cubic boron nitride layer and the diamond layer are in an epitaxial relationship. In further exemplary embodiments, the thickness of the cubic boron nitride layer can be greater than 200 nm, greater than 700 nm, or thicker still. The cBN film is substantially pure, being substantially free of interfacial amorphous and turbostratic layers and having substantially no top non-cubic layer. This is in contrast to cBN films referred to above that are also adhered to substrates such as diamond, but include interfacial aBN and tBN transition layers.

In another form thereof, the present invention provides a cutting tool, comprising a substrate and a diamond layer overlying the substrate. A layer of substantially pure cubic boron nitride is adjacent to and in contact with the diamond layer. The cubic boron nitride layer defines at least a portion of a cutting surface of the cutting tool, and has a thickness of at least 700 nm. In exemplary embodiments, the cBN layer and diamond layer are in an epitaxial relationship. There may be an epitaxial relationship among the cBN layer, diamond layer and substrate. The cBN layer is preferably substantially pure, being free of interfacial transition aBN and tBN layers.

The inventors have been able to passivate their inventive films and avoid the formation of unstable oxyhydrides at the interface which leads to delamination. Without wishing to be tied to any theory, it is believed that the superior films are achieved in one exemplary embodiment by a synergystic CVD process assisted by fluorine and an extremely high ion-to-deposited atom ratio based on an ionization process with metastable excitation states. This process enables lower energy, much closer to thermal kinetic energies of particles. The inventors use the lowest energies of particles, which together with inherent diamond properties produces high-quality and substantially pure cBN films that do not include interfacial aBN/tBN and top non-cubic BN layers.

Advantageously, the present invention allows preparation of substantially pure diamond/cBN super-lattices. Further, the present invention allows a wide range of thicknesses depending upon the application for which the cBN layer is to be put. For example, for practical applications in which the inventive composite structure is to be used as a coating for a cutting surface in a cutting tool, the film thickness can be greater than 2 μm, and is typically between 2-4 μm. In other applications, the invention can be used to form very thin films which enhance the strength of the composite.

In still other applications, the inventive films can be made sufficiently thick to form a self-standing cubic boron nitride—diamond (cBND) bilayer. For example, the self-standing cBND bilayer composite can be prepared on substrates which do not dissolve carbon or on substrates which carbon solubility is very limited and substrates on which diamond does not adhere. One suitable substrate for such applications is copper. Diamond can be deposited on copper at a thickness of about 0.5-1 mm, and the diamond is then separated from the copper substrate. At that point, pure CVD diamond is used for growing cBN several micrometers thick. The self-standing cBND composite is than brazed by diamond face to adhere to the cutting tools. The cutting performance and lifetime of such systems is further enhanced.

Thus, the present invention provides a composite bilayer structure comprising substantially pure diamond and substantially pure cBN layers in sequence, which, as noted above, has been difficult to synthesize, since transition interfacial aBN and tBN layers precede the formation of the cBN film. Using the inventive method, however, substantially pure cBN can be grown on diamond and even in epitaxial relationship, without aBN and tBN interfacial precursor layers. Thus, the composite produced has a top cBN layer with the second highest hardness and highest thermal conductivity directly nucleated to the diamond layer, which provides superior mechanical supporting capacity and highest thermal conductivity. More importantly the cBN layer chemically protects the diamond. Hence, the cBND bilayer is an ideal system for cutting tool applications particularly, extremely hard tool steels.

The inventive cBND composite is quite effective in cutting performance and heat dissipation. In return, temperature in the contact area of the tool with a workpiece is significantly lowered and therefore machining speed can be increased considerably. The capacity to operate at high temperature enables further increasing temperature when compared with conventional and softer cutting tools. Due to these properties the cutting tool can last longer and the machining throughput is substantially increased. This is obviously highly economically advantageous.

According to another aspect of the present invention there is provided a method of fabricating a composite structure comprising a substrate, an intermediate diamond layer, and a layer of cubic boron nitride, comprising the steps of: forming diamond nuclei on a substrate, growing a layer of diamond film on the substrate, and depositing a top layer of cubic boron nitride on the diamond layer to form a composite structure of cubic boron nitride/diamond film on the substrate.

Preferably the substrate may be pre-treated prior to formation of the diamond layer. This pretreatment may comprise, for example, pre-scratching to enhance nucleation and subsequent adhesion of the diamond layer, or pre-treatment to remove undesirable chemical components from the substrate (eg any component that may act catalytically to convert the diamond to graphite phase).

The diamond film may be formed by chemical vapour deposition, while the cBN layer may be formed by chemical vapour deposition or physical vapour deposition.

BRIEF DESCRIPTION OF THE DRAWINGS

Some embodiments of the invention will now be described by way of example and with reference to the following Figures, in which:-

DETAILED DESCRIPTION OF THE PREFERRED EMBODIMENTS

Figure 1:
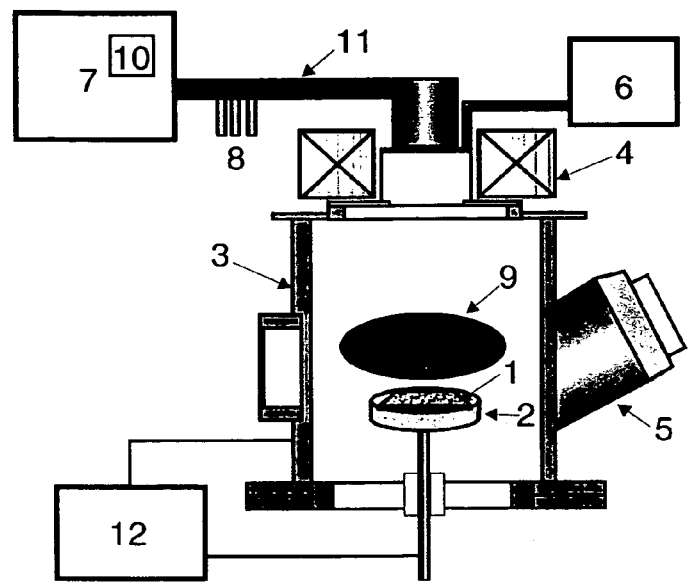
FIG. 1 is a schematic view of an apparatus for the use in carrying out a method according to an embodiment of this invention.

As will be seen from the following description, at least in its preferred forms the present invention provides environmentally/humidity non-sensitive and highly adherent cBN/diamond (cBND) composite coatings on a variety of substrates and their production technology. The cBND coatings consist of a top layer of substantially pure cBN and a substantially pure diamond layer underneath. The diamond layer underneath is deposited prior to the cBN film and provides structural compatibility, high adhesion, extreme supporting capacity for any mechanical applications and enables heteroepitaxial growth of cBN films.

The diamond layer underneath can be grown via buffer layers such as pretreated nitrides or specially pretreated materials, for example, prescratching and chemical etching of some substrate components to eliminate their catalytic effect inducing graphitic phase. Growing such adherent cBND layers on various substrates opens many industrial applications.

The present cBND composite films and preferred methods of their production involve a multiple-step procedure. First of all the substrates are pretreated using prescratching, chemical etching methods or a combination thereof depending on the substrates used. Alternatively, the pretreated substrates can be coated by a buffer layer, for example, with nitride or carbide layers or their combinations and gradient layers. The buffer layers can further be prescratched. All these pretreatments and precoatings can be combined prior to the deposition of the cBND composite. Thus, the cBND compatibility and adherence to the substrate is aided by the pretreatment procedure and/or gradient buffer layers, which in the case of some substrates can be more complex.

Subsequently, a continuous diamond film is formed, for example, by CVD methods. The diamond film thickness may vary upon the cBND applications. Finally the last component of cBND, cubic boron nitride is deposited onto the diamond interlayer using CVD or PVD methods.

The first component of the cBND composite, the diamond film, is prepared in a two sub-step process, i.e., nucleation and growth. The diamond nuclei are preferably formed either by bias-enhanced nucleation or by pre-scratching the substrate prior to nucleation. During nucleation a higher concentration of carbon precursors is normally used. The second component of cBND composite, cBN film can be grown directly on diamond films in a single growth process using particle energies close to the thermal energies. Neither amorphous nor tBN transition layers are needed for the formation of cBN films, and the cBN films show epitaxial relationship with the underlying diamond films.

Since the cBN and diamond are compatible in terms of their structures and physical properties there are no problems in adhesion as far as the adhesion cBND via diamond-substrate or diamond-substrate-buffer layer is provided. The absence of a hydroscopic aBN/tBN interface makes the cBND composite non-sensitive to humidity. In addition, diamond underneath with the highest hardness of all known materials provides cBN the best supporting capacity in all mechanical applications. Thus, the cBND coating composites are superior in ultrahard cutting tools for machining ferrous materials and their compounds at high speed and high temperatures, which are not otherwise possible by diamond-coated cutting tools. The isoelectronic properties of diamond and cBN, and epitaxial growth confined in cBND composites, allow use of these materials in electronics.

The deposition of the first component of a cBND composite, a diamond layer, is preceded by diamond nucleation on a pretreated or/and precoated substrate which has the capacity to accommodate cBND composite with excellent adhesion. Firstly diamond is nucleated using either bias-enhanced nucleation [X. Jiang, C. P. Klages, Diamond Relat. Mater., vol. 2, pps. 1112-1113, "Heteroepitaxial diamond growth on (100) silicon", 1993] on a non-diamond substrate or enhanced nucleation employing scratching non-diamond substrate by hard powders of different composition and size such as diamond, SiC, $Al_2O_3$ or cBN. Secondly randomly oriented or highly oriented diamond films are grown by CVD methods via controlling alpha parameters, i.e., the concentration of carbon precursors in a hydrogen-based deposition environment and elevated substrate temperatures. In the case of heteroepitaxial growth of cBN films on diamond, highly oriented films are preferred in this intermediate step. Thirdly the cBN films are deposited by either CVD or PVD methods. More details of this process and the resulting cBND structures are described below.

FIG. 1 shows a schematic diagram of a microwave plasma apparatus employed for fabricating cBND composite films in accordance with an embodiment of this invention. The apparatus includes sample 1, sample holder 2, reaction chamber 3, magnetic coil 4, turbomolecular pump 5, gas supply units 6, 2.45 GHz microwave generator 7, impedance transformer 8, powermeter 10, 11—waveguide 11, and biasing power supply 12. Reference numeral 9 indicates a plasma ball. When a magnetic field of ~875 G is applied to the central region of the reaction chamber using an external magnetic coil 4 under low pressure conditions, an electron cyclotron resonance (ECR) mode of the system operation can be employed in the fabrication method of cBND films.

In preferred embodiments of this invention, a number of the parameters of the fabrication process, such as the choice of substrate, pretreatment, precoating, nucleation technique, the method of forming the diamond film, and the method of forming the cBN film, can be varied depending upon the particular substrate and intended use of cBND composite films.

In the preparation of the diamond film, which serves as the base material for the manufacture of cBND composite films, CVD environments including either cold or thermal plasmas excited by direct current, alternating current, radio-frequency, microwave or other electromagnetic radiations are possible. Flame methods can be applied as well. Similarly, the top cBN layer can be prepared by CVD methods using either cold (non-equilibrium) or thermal (equilibrium) plasma driven by direct, alternating current, high-frequency current, and microwaves or other electromagnetic radiations. Depending on the excitation method used, power can be supplied into the plasma via internal electrodes, capacitive and inductive coupling, antenna coupling, resonator coupling, surface-wave excitation or other known methods. As seen, in the case of diamond film deposition demonstrated as an example below, cold plasma was induced by microwaves, which were fed into a reactor via an impedance transformer. The same system was used for depositing the cBN top layer. However, the system operated in an electron cyclotron resonance (ECR) mode and used a different reactive environment in term of composition, total pressure and control parameters including substrate bias and temperature.

The top cBN layer of cBND composite can also be prepared by a variety of ion assisted physical vapor deposition (PVD) methods including magnetron sputtering, ion assisted deposition, biased plasma deposition and ion beam deposition. [T. Yoshida, *Diamond Relat. Mat.*, vol. 5, pps. 501-507, "Vapour phase deposition of cubic boron nitride", 1996; P. B. Mirkarimi, K. F. McCarty, and D. L. Medlin, *Mater. Sci. Eng.*, vol. R21, pps. 47-100, "Review of advances in cubic boron nitride film synthesis", 1997]. The bombardment by energetic species (tens to hundreds of eV) coupled with the exposure to boron and nitrogen species (examples of the different exposure routes are: sputtering of a BN target, sputtering or evaporation of boron, boron containing gas, nitrogen or nitrogen containing gas) can be employed for the formation and the cBN phase growth. However, the cBN formation within the cBND composite promotes lower particle kinetic energies, which range expands from very high energies down close to the thermal energies of particles.

The deposition environment of the base diamond film is established predominantly on plasma-activated carbon precursor (e.g., methane, carbon oxide)-hydrogen gas mixture. The optimum flow rates of such reactant gases may vary considerably depending on the plasma type, method of plasma generation, gas pressure, geometrical configuration of a reactor and other processing parameters.

With respect to the gas used in the synthesis of cBN films for the construction of cBND composite layers by CVD, at least one compound selected from the groups of boron hydrides (e.g., diborane and decaborane), boron halides (e.g., boron trichloride and boron triflouride), borohydrides (e.g., sodium borohydride), borofluoride (e.g., ammonium borofluoride or trimethylboride—TMB), or organic boron compounds such as triethoxyboron may be used as a boron source. On the other hand, at least one member selected from the group consisting of nitrogen gas, hydrides of nitrogen such as ammonia and hydrazine, fluorides of nitrogen such as nitrogen trifluoride and nitrogen tetrafluoride, etc. may be used as a nitrogen source. The boron gas and nitrogen gas sources react to precipitate boron nitride. In the example below, the gases are selected so that fluorine is surely present in the gas phase to take advantage of the fact that fluorine can selectively etch non-cubic BN. Fluorine can also be added into a gas mixture using fluorine gas, hydrogen fluoride, halogen fluoride such as chlorine trifluoride or bromine trifluoride, or a halide of an inert gas such as xenon fluoride, or fluorine obtained by decomposition of an organic fluorine compound such as tetrafluoromethane, a fluorine compound such as sulfur hexafluoride, sulfur tetrafluoride, silicon tetrafluoride, phosphorous pentafluoride or a metal fluoride can be supplied into the gas phase, in addition to the compounds above.

Further, an inert gas such as argon or helium, or a hydrogen gas can be optionally added to the gas phase for controlling the plasma stability, plasma density, deposition rate and film properties. Instead of using separate chemical species of nitrogen and boron, a single chemical species such as amine borane, borazine, aminoborane or dimethylaminoborane can be added to the gas phase. The optimum flow rates of such material gases vary significantly depending on the plasma type, the method for generating the plasma, the geometrical configuration and size of deposition apparatus, pressure, substrate bias voltage and the like.

The fabrication method of the intermediate diamond films may use a gas phase pressure of the order from $10^{-4}$ to $10^2$ Torr. In the example to be described below, working in microwave plasma CVD system and ECR operation mode, a pressure from 20 to 100 Torr is recommended for providing a high reaction rate and ease of control of the deposition. For the deposition of the top cBN films in cBND composite layers, working in an ECR mode at a pressure of $10^{-3}$ Torr is recommended. Such implemented conditions provide the high density of reactive radicals, high ion-to-neutral ratio and thus high reaction rate, and simple control of the deposition.

In embodiments of the present invention, the deposition of cBND composite layer can be prepared on a variety of non-diamond substrates including semiconductors (e.g., silicon or silicon carbide and nitride), insulators (e.g., quartz and sapphire), metals such (e.g., platinum and iridium), and alloys (e.g., tungsten carbide), which can, however, be pretreated as described above.

The formation of the diamond layer in cBND composite films can be prepared by both PVD and CVD methods at temperatures widely ranging from room temperature to 1400° C. In terms of the deposition by ECR MW CVD, the practical range is from 600 to 1300° C.

The surface morphology and the orientation of the intermediate diamond film in cBND composite are controlled via the growth parameters [C. WILD, et al., Diamond Relat. Mater., vol. 3, pps. 373-381, "Oriented CVD diamond films—Twin Formation, Structure and Morphology", 1994]. The growth rate in both the [001] and [111] growth directions is controlled by changing the concentration of carbon precursor in the CVD environment, substrate temperature and other parameters. The [001]-oriented diamond films are preferable in terms of the epitaxial deposition of cBN films for electronic applications.

The fabrication method of the top cBN layer in the cBND composite can employ direct current and/or high frequency or radio-frequency bias with negative offset. The practical value of negative bias ranges from −10 V to −1500 V which is along with the plasma potential responsible for the energy and momentum of incident ions. Therefore, it varies with many parameters including the method of generating plasma, gas composition, gas pressure and substrate materials.

The parameters leading to the nucleation and growth of cBN by ion assisted PVD methods include: (1) a minimum ion energy necessary to promote nucleation, (2) a minimum substrate temperature, (3) a proper balance between the energetic species and the thermal species (I/A ratio), (4) a proper balance of the species involved (B, N, and foreign species) allowing to establish an equilibrium between the incorporation on one hand and the sputtering/etching/desorption rates on the other hand.

Depending on the application fields desired, the phase purity (cBN content) of cBN film can be controlled by varying the gas composition in the plasma, substrate bias voltage, substrate temperature and other deposition parameters.

The following examples are presented for a further understanding of the cBND composite and method of cBND preparation by means of embodiments of the present invention.

EXAMPLE 1

Figure 2:
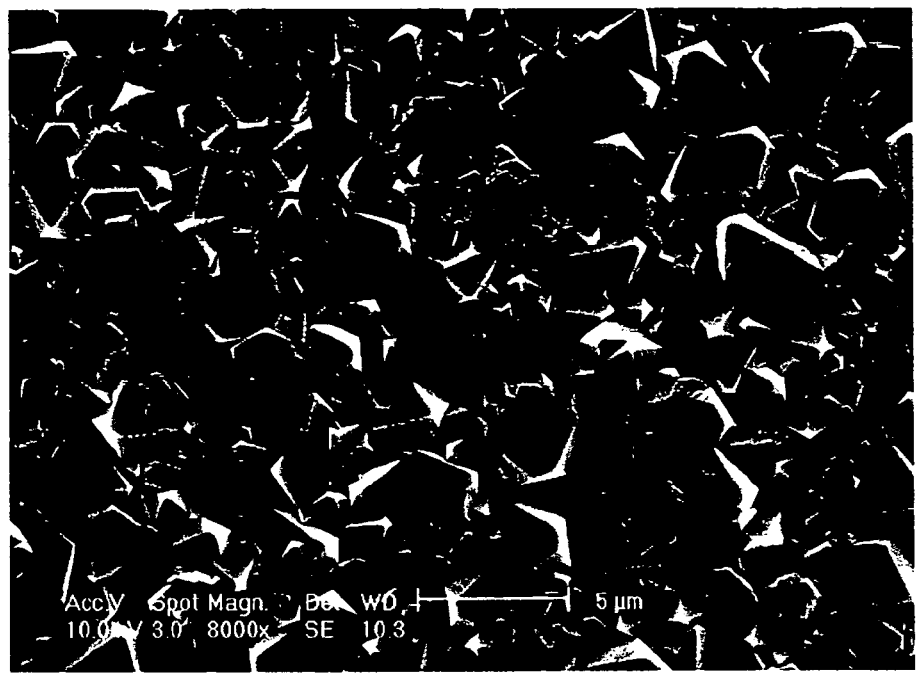
FIG. 2 is a scanning electron microscopic image of a substrate formed with a diamond film in an intermediate stage of an embodiment of the present invention.

A diamond film, an SEM plain-view image of which is shown in FIG. 2, with a thickness of about 5 μm was prepared by microwave plasma CVD with controlled growth parameters such as the concentration of carbon precursor and temperature using the CVD apparatus shown in FIG. 1.

Figure 3:
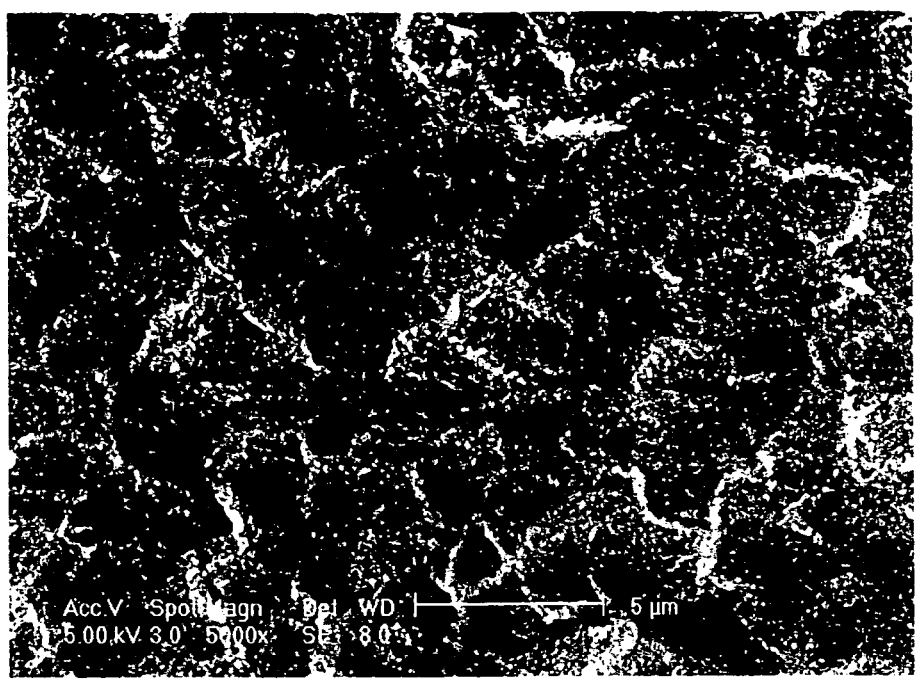
FIG. 3 is scanning electron microscopic surface morphology of a cBND composite with a top cBN film formed in accordance with an embodiment of the invention.
Figure 4:
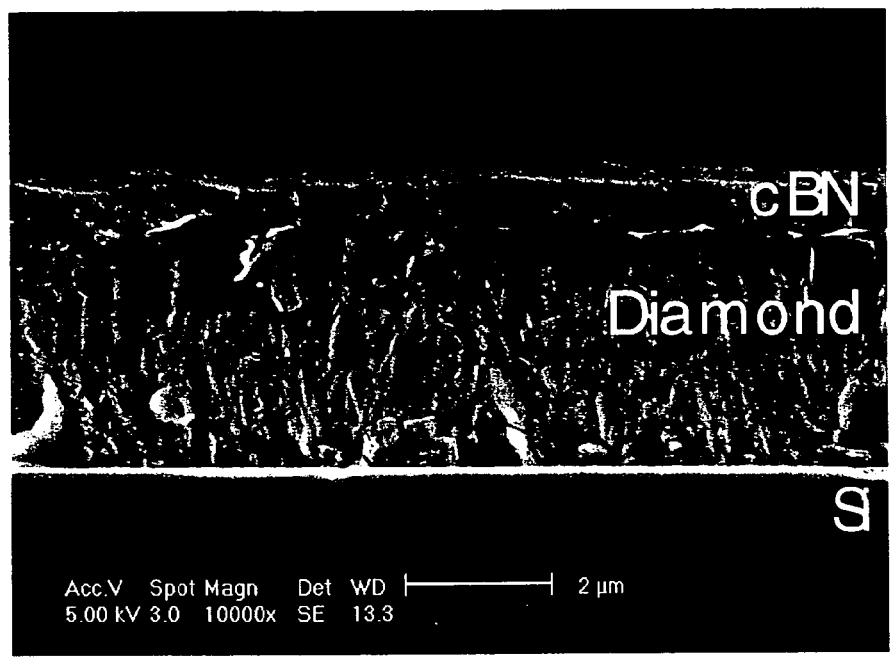
FIG. 4 is a scanning electron microscopic cross-sectional morphology of the cBND composite film of FIG. 3.

The cBN film was subsequently deposited in the same apparatus, but prior to the deposition the reactor chamber was evacuated to $10^{-6}$ Torr by a turbo-molecular pump 5 and then $BF_3$, $N_2$, He, Ar, and $H_2$ at gas flow rates of 1, 50, 140, 10 and 3 sccm, respectively, were supplied into the chamber from a gas supply unit 6 to secure the operation pressure of $2\times10^{-3}$ Torr. Using such conditions and a magnetic field of ~875 gauss applied to the central region of the reaction chamber employing an external magnetic coil 4, the deposition was carried out in an electron cyclotron resonance (ECR) mode. The 1500 W microwave power at 2.45 GHz was supplied by a microwave generator 7 and fed via a waveguide 11. The reflected microwave power was adjusted to its minimum value, close to zero, using the impedance transformer 9. Both the forward and reflected microwave powers were constant and monitored over the entire deposition. In this particular case, direct current bias of −30 V, provided by a dc power supply 11, was applied to the substrate with respect to the grounded chamber. The cBN film was deposited at a substrate temperature of 950° C. for 2 hours in order to obtain a continuous film as demonstrated by scanning electron microscopic (SEM) images in FIGS. 3 and 4. FIGS. 3 and 4 are SEM plain-view with a top cBN layer and cross-sectional images of the cBND composite film deposited by this process, respectively. The cBND composite with a continuous top cBN film of about 700 nm thickness is clearly demonstrated. As noted above, one of skill in the art should appreciate that the present teachings provide the advantage of allowing cBN thicknesses that are greater than 200 nm, which had hitherto been an obstacle. The present teachings allow creation of cBN film thickness greater than 700 nm without delaminating.

Figure 5:
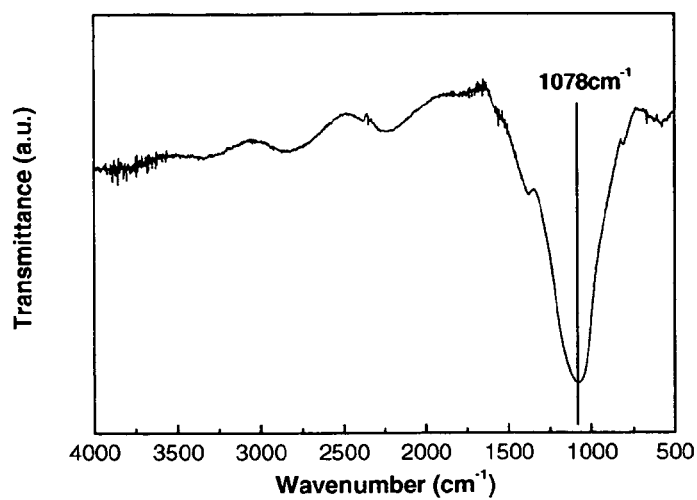
FIG. 5 illustrates the Fourier-transformed infrared spectrum obtained from the cBND composite film of FIG. 3.

FIG. 5 is a Fourier-transformed infrared absorption spectrum collected from the sample of FIGS. 3 and 4. The infrared absorption of cubic boron nitride significantly appears in the vicinity of 1070 cm$^{-1}$. The absorption peaks at 780 and 1360 cm$^{-1}$ indicate a diminutive content of hexagonal/turbostratic/amorphous boron nitride in the film. From the spectrum, the content of such non-cubic phase is less than 10%, such that the cBN film is substantially pure.

Figure 6:
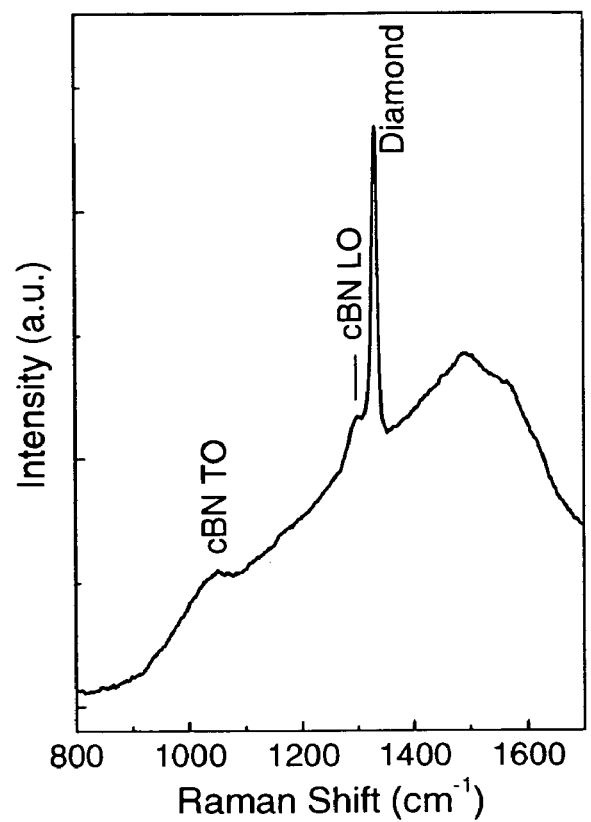
FIG. 6 illustrates the Raman spectrum obtained from the cBND composite film of FIG. 3.
Figure 7:
FIG. 7 is a cross-sectional transmission electron microscopy (TEM) image taken from the cBND composite film.

FIG. 6 is a graph illustrating a Raman spectrum collected from the cBND composite film, shown in FIGS. 3 and 4, using backscattering geometry and an argon ion laser with an excitation line at 514.5 nm. The characteristic diamond scattering mode present at 1331 cm$^{-1}$ indicates the existence of diamond intermediate layer in cBND composite. Scattering peaks of cubic boron nitride by phonon of an optical longitudinal wave mode at 1300 cm$^{-1}$ and by phonon of an optical transverse wave mode at 1050 cm$^{-1}$ also distinctly appears, showing the composite nature of the cBND structure. Transmission electron microscopic (TEM) analysis, in FIG. 7, indicates a columnar structure of the cBND composite film. Both cBN and diamond form continuous columns extended from silicon substrate via diamond-cBN interface to the top surface of cBND composite.

The detailed TEM analyses show that cBN directly nucleates on diamond, and forms continuous columns extending from diamond to its surface. No incubation layer (aBN/tBN) for the nucleation of cBN in cBND structure is observed, which can also be proved by the absence of tBN diffraction pattern.

EXAMPLE 2

Figure 8:
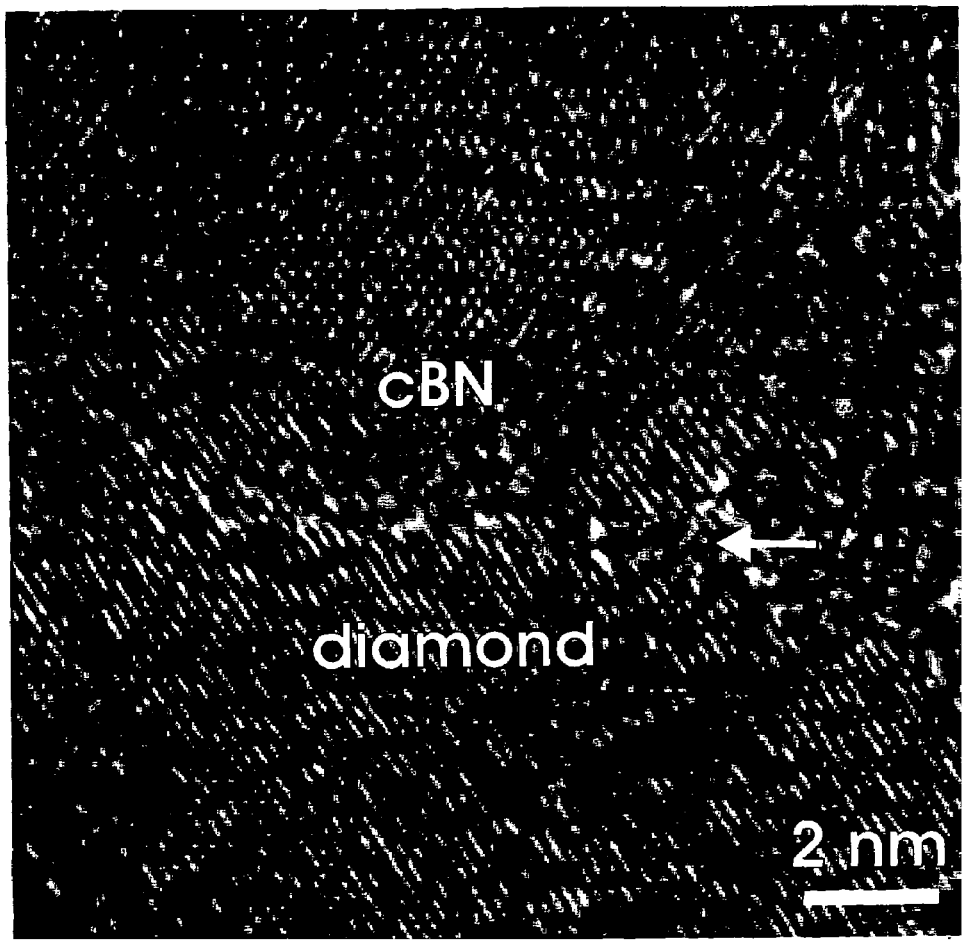
FIG. 8 is a cross-sectional high-resolution TEM image taken from the interfacial region between the cBN and diamond films.

In a cBND composite with [001]-oriented diamond films serving as base/intermediate layer, heteroepitaxial growth of cBN films on diamond may be obtained. The cBN deposition was performed in the same deposition system as described above in EXAMPLE 1. The epitaxial orientation relationship between cBN and underlying diamond is demonstrated by the high-resolution TEM image as shown in FIG. 8.

Cubic boron nitride incorporated in cBND composite has the second highest hardness and second highest thermal conductivity next to diamond, however, unlike diamond it is chemically inert to ferrous materials and their compounds at high temperature. Accordingly, the cBND composite films without any aBN/tBN incubation layer required for cBN nucleation by the present invention is practical for coating cutting tools. The extraordinary properties of cBND composite comes from the cBN-diamond compatibility in terms of their structures and physical properties, ease of cBND accommodation on a variety of substrates with high adhesion and the excellent supporting capacity of diamond in any mechanical applications. Further, the epitaxial growth of cBN on diamond is the fundamental provision for preparing p- and n-type semiconductors, and p-n junction devices such as diodes or transistors which may be potentially exploited in power electronics and optoelectronics operating in harsh environment.

At least in its preferred forms therefore, the present invention provides cBN/diamond (cBND) composite films and methods of their fabrication via multiple steps. The substrate may preferably be pretreated or/and pre-coated to accommodate cBND composite films with high adherence. The pretreatment can be in a single or multiple step process. A pretreatment such as prescratching provides high nucleation density and enhances adhesion. On the other hand chemical etching depletes undesirable chemical elements in close surface regions. Under undesirable chemical elements are understood such elements which have a catalytic effect on the conversion of diamond to graphite phase. These elements can also be isolated by diffusion buffer and gradient buffer layers. The buffer layers also diminish the differences in physical properties of the cBND composite and substrate. The gradient buffer layer can be established on hard nitride compounds. All these methods can be combined in accordance with the substrate used.

The difficulties associated with using cBN coatings in the prior art have been substantially mitigated by synthesizing cBN in the form of cBND composite films on the surfaces of materials of interest and via buffer layers if required. The cBN layers are substantially pure, being free of any boron nitride incubation layer or transition layer. Such composites with top cBN layers are endowed with excellent adherence, chemical inertness, extremely high hardness, low friction coefficient and very high supporting capacity for the top cBN layer provided by the diamond. All these superior properties enable applications of cBND composites in protective, tribological and other mechanical applications. In addition, the wide bandgap and isoelectronic properties to diamond with capacity for n- and p-type doping make it suitable for some special electronic applications.

All the references cited herein are hereby expressly incorporated by reference into the present application.

What is claimed is:

1. A composite structure comprising:
   a diamond layer;
   a layer of substantially pure undoped cubic boron nitride adjacent to and in contact with the diamond layer, wherein the portion of the layer of cubic boron nitride that is adjacent to the diamond layer is substantially free of any boron nitride incubation layer or transition layer, said layer having a thickness greater than 200 nm; and
   a substrate, the diamond layer overlying the substrate;
   wherein an epitaxial relationship exists between the cubic boron nitride layer and the diamond layer.

2. The composite structure of claim 1, further comprising a buffer layer between the diamond layer and the substrate.

3. The composite structure of claim 1, wherein the substrate is selected from the group consisting of silicon, silicon carbide, quartz, sapphire, platinum, iridium, tungsten and carbide.

4. The composite structure of claim 1, wherein the substrate is a semiconductor material.

5. The composition structure of claim 1, wherein the thickness of the cubic boron nitride layer is greater than 700 nm.

6. A composite structure comprising:
   a substrate;

a diamond layer overlying the substrate; and a layer of cubic boron nitride adjacent to and in contact with the diamond layer;

wherein the portion of the layer of cubic boron nitride that is adjacent to the diamond layer is substantially free of any boron nitride incubation layer or transition layer; and wherein an epitaxial relationship exists between the cubic boron nitride layer and the diamond layer.

7. The composite structure of claim 6, wherein the cubic boron nitride layer is substantially pure.

8. The composite structure of claim 6, wherein the cubic boron nitride layer is nucleated directly to the diamond layer.

9. The composite structure of claim 6, wherein the thickness of the cubic boron nitride layer is greater than 200 nm.

10. The composite structure of claim 6, wherein the thickness of the cubic boron nitride layer is greater than 700 nm.

11. The composite structure of claim 6, wherein a buffer layer is provided between the diamond layer and the substrate.

12. The composite structure of claim 6, wherein the substrate is selected from the group consisting of silicon, silicon carbide, quartz, sapphire, platinum, iridium, tungsten and carbide.

13. The composite structure of claim 6, wherein the substrate is a semiconductor material.

14. The composite structure of claim 6, wherein the diamond layer has a random or (001) orientation.

15. The composite structure of claim 6, wherein the cBN layer is doped.

16. The composite structure of claim 6, wherein the diamond and cubic boron nitride layers together have a thickness of at least about 2 μm.

* * * * *